(12) United States Patent
Chan et al.

(10) Patent No.: US 6,381,115 B1
(45) Date of Patent: Apr. 30, 2002

(54) REDUNDANT ELECTRIC FUSES

(75) Inventors: Tsiu Chiu Chan, Carrollton; Elmer Henry Guritz, Flower Mound, both of TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/467,617

(22) Filed: Dec. 20, 1999

(51) Int. Cl.⁷ ................................................ H02H 5/04
(52) U.S. Cl. ...................... 361/125; 361/104; 361/115; 361/124; 327/525
(58) Field of Search ................................ 327/525, 526; 361/125, 115, 124, 104; 307/99, 100

(56) References Cited

U.S. PATENT DOCUMENTS 4,354,217 A * 10/1982 Mahon ...................... 361/104
5,387,823 A * 2/1995 Ashizawa .................... 326/13
6,014,052 A * 1/2000 Coupe, II ................... 327/525

* cited by examiner

Primary Examiner—Josie Ballato
Assistant Examiner—Robert L. Deberadinis
(74) Attorney, Agent, or Firm—Lisa K. Jorgenson; Robert D. McCutcheon

(57) ABSTRACT

A redundant electric fuse circuit is provided that includes a plurality of fuses coupled in series and each having a fuse control device operable for generating a current through each fuse sufficient to blow the fuse. A first fuse control signal is activated to generate a sufficient current through one of the fuses to blow the fuse. A second fuse control signal is activated to generate a sufficient current through the other fuse to blow that fuse. The electric fuse circuit provides redundancy thereby increasing the yield of integrated circuits by reducing the probability that a defective fuse (i.e., a fuse that reforms after blowing) will cause a fatal defect in the integrated circuit.

21 Claims, 1 Drawing Sheet

REDUNDANT ELECTRIC FUSES

TECHNICAL FIELD

The present invention relates to fuses in integrated circuits and, in particular, to multiple electric fuses for redundancy.

BACKGROUND

Fuses are devices extensively used in integrated circuits to provide a way to program, repair, or modify the operation of, an integrated circuit after the circuit has been manufactured. Typical applications for semiconductor fuses include programmability of memory (PROM, EPROM) and disablement/enablement of certain circuitry for redundancy purposes (memories), and the like.

The two main types of fuses in common use by the semiconductor industry are electric fuses and optical fuses. Optical fuses are blown (or open-circuited) using radiation (such as laser) while electric fuses are blown by an electric current flowing through the electric fuse. In many applications, electric fuses are preferred over optical fuses due to the complexity and time needed to blow optical fuses using radiation.

One problem that exists with electric fuses is that sometimes after an electric fuse is blown, the fuses can reform upon cooling or sometime thereafter. While additional and complex testing may detect such a defect, it is generally desirable to blow the fuse(s) and perform no additional testing (in most cases, the testing has already been performed prior to the blowing of the fuses). In addition, even though duplication of the step of blowing the fuse may sometimes bring success in re-blowing a fuse that has reformed immediately, there is still a substantial possibility that the fuse may reform again after packaging of the die or during use in the field. If this occurs, the integrated circuit will be (or become) defective and cannot be repaired, thereby reducing the yield or affecting the IC during customer operation.

Accordingly, there exists a need to increase the yield of integrated circuits (and decrease the likelihood of failure in the field) that utilize electric fuses therein by reducing the likelihood that a reformed electric fuse (reformed after blowing) will cause a fatal defect.

SUMMARY

According to the present invention, there is provided a fuse circuit in an integrated circuit. The fuse circuit includes a first fuse of conductive material and having a first side coupled to a first node and a second side coupled to a second node, and a first control device having a first terminal, a second terminal, and a control terminal, such that the first terminal is coupled to the first node, the second terminal is coupled to a first reference voltage, and the-control terminal is coupled to a first fuse control signal whereby the first control device is operable, in response to the first fuse control signal, to cause an electric current to flow through the first fuse sufficient to blow open the first fuse. The fuse circuit also includes a second fuse of conductive material and having a first side coupled to the second node and a second side coupled to a second reference voltage, and a second control device having a first terminal, a second terminal, and a control terminal, such that the first terminal is coupled to the second node, the second terminal is coupled to a third reference voltage and the control terminal is coupled to a second fuse control signal whereby the second control device is operable, in response to the second fuse control signal, to cause an electric current to flow through the second fuse sufficient to blow open the second fuse.

In another embodiment of the present invention, there is provided a circuit for providing fuse redundancy in an integrated circuit. The circuit includes a series-coupled plurality of fuses of conductive material with one end coupled to a first voltage reference. Each of the plurality of fuses is coupled to a fuse control device for controlling an electric current flowing through the fuse in response to a fuse control signal. A second end of the plurality of fuses is coupled to the first voltage reference when none of the plurality of fuses are blown and decoupled from the first voltage reference when at least one of the plurality of fuses is blown.

In yet another embodiment, there is provided a method of blowing electric fuses. The method includes the steps of generating a first electric current flowing through a first fuse and a second fuse, with the electric current having a magnitude sufficient to blow the first fuse. A second electric current is generated that flows through the second fuse sufficient to blow the second fuse, such that a first end of the second fuse is coupled to a first voltage reference.

BRIEF DESCRIPTION OF THE DRAWINGS

For a more complete understanding of the present invention, and the advantages thereof, reference is made to the following description taken in conjunction with the accompanying drawings, wherein.

DETAILED DESCRIPTION OF THE INVENTION

Figure 1:
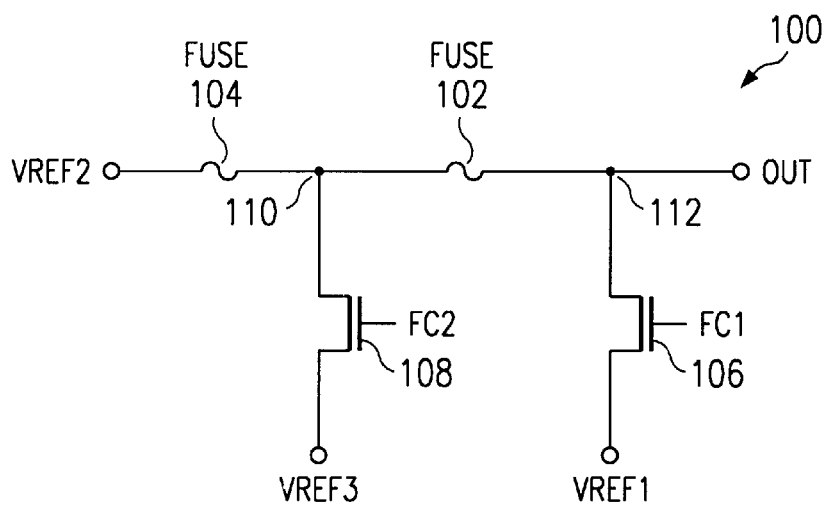
FIG. 1 is a schematic diagram illustrating redundant fuses in accordance with the present invention.

With reference to the drawings, like reference characters designate like or similar elements throughout the drawings.

Now referring to FIG. 1, there is shown a schematic diagram a fuse circuit 100 in accordance with the present invention. The fuse circuit 100 includes a fuse 102, a fuse 104, a fuse control device 106 and a fuse control device 108, as shown in FIG. 1.

One end of the fuse 102 and one terminal of the fuse control device 106 are coupled to a node 112, while the other end of the fuse 102, one end of the fuse 104 and one terminal of the fuse control device 108 are coupled to a node 110. Another terminal of the fuse control device 106 is coupled to a first voltage reference VREF1 with the control terminal coupled to a fuse control signal FC1. Additionally, the other end of the fuse 104 is coupled to a second voltage reference VREF2. Another terminal of the fuse control device 108 is coupled to a third voltage reference VREF3 with the control terminal coupled to a fuse control signal FC2.

The fuses 102, 104 are electric fuses of the type that are blown when a predetermined amount of current flows through the fuse. The fuses 102, 104 are constructed of a conductive material, such as polysilicon. In a preferred embodiment, the fuses 102, 104 are constructed of doped polysilicon that is unsalicided. Additionally, the fuses 102, 104 each have a resistance and a power dissipation per unit cross section area (or current density) (and assuming height (or thickness) is constant) associated therewith depending on geometry and composition of the fuse. In a preferred embodiment, the power dissipation per unit cross section area of the fuse 102 is greater than the power dissipation per unit cross section area of the fuse 104, and preferably about two times or more greater. As will be appreciated, and assuming a substantially same composition and same thickness of conductive material for both fuses 102, 104, in order to achieve a larger power dissipation per unit cross section area for the fuse 102, the fuse 102 is shaped such that it is more narrow (and with the same length) than the fuse 104. Thus, if the thickness and length are the same for the two fuses, then a smaller width provides a greater power dissipation per unit cross section area. It will be understood that one of ordinary skill in the art can easily select a composition and shape (length, height, and width) of the fuses to achieve the desired result.

In the one embodiment, the fuse control devices 106, 108 are MOS transistors, and in a preferred embodiment, the devices 106, 108 are n-channel devices and the second voltage reference (VREF2) is Vdd (or power) while the first and third reference voltages (VREF1, VREF3) are both ground. As will be appreciated, first and third reference voltages do not have to be at the same voltage reference, provided the voltage values are sufficient to provide a current flowing between the second reference voltage (VREF2) and the first voltage reference (VREF1) (flowing through the fuses 102 and 104) when the fuse control device 106 is turned 'on', and to provide a current flowing between the second reference voltage (VREF2) and the third voltage reference (VREF3) (flowing through the fuse 104) when the fuse control device 104 is turned 'on'. It will be understood that the fuse control devices 106, 108 are relatively large transistors having a substantial W/L ratio adequate to allow a sufficient current to flow through the fuses in order to blow the fuses. It will also be understood that the fuse control devices 106, 108 may alternatively be p-channel MOS transistors.

The basic operation of blowing the fuses 102, 104 of the fuse circuit 100 will now be described (assuming VREF2 is power and VREF1 and VREF3 are both ground). The fuse control signal FC1 is activated thereby turning on the fuse control device 106 and generating a current flowing through both the fuses 102, 104 sufficient to blow (open circuit) the fuse 102. Due to the higher power dissipation per unit cross section area of the fuse 102, the fuse 102 will incur higher power dissipation (get hotter) than the fuse 104 and will blow first. As will be appreciated, the period of time needed for blowing fuse 102 will depend mainly upon the composition and geometry of the fuse 102, the voltage differential between VREF2 and VREF1, and the size of the fuse control device 106.

After fuse 102 is blown, the fuse control signal FC2 is activated thereby turning on the fuse control device 108 and generating a current flowing through the fuse 104 sufficient to blow the fuse 104 (open circuit). As will be appreciated, the period of time needed for blowing fuse 104 will depend mainly upon the composition and geometry of the fuse 104, the voltage differential between VREF2 and VREF3, and the size of the fuse control device 108.

Having a redundant fuse system in accordance with the present invention increases the yield of integrated circuits that utilize fuses to repair or modify circuitry (e.g., redundant rows or columns in memory). It will be understood that if a fuse itself is inoperable or defective due to failure to blow (i.e., reformed after blowing), then an integrated circuit that would normally be operational if the fuse operated as desired will be defective. The present invention decreases the probability that a defective fuse will cause a fatal defect in an integrated circuit.

Figure 2:
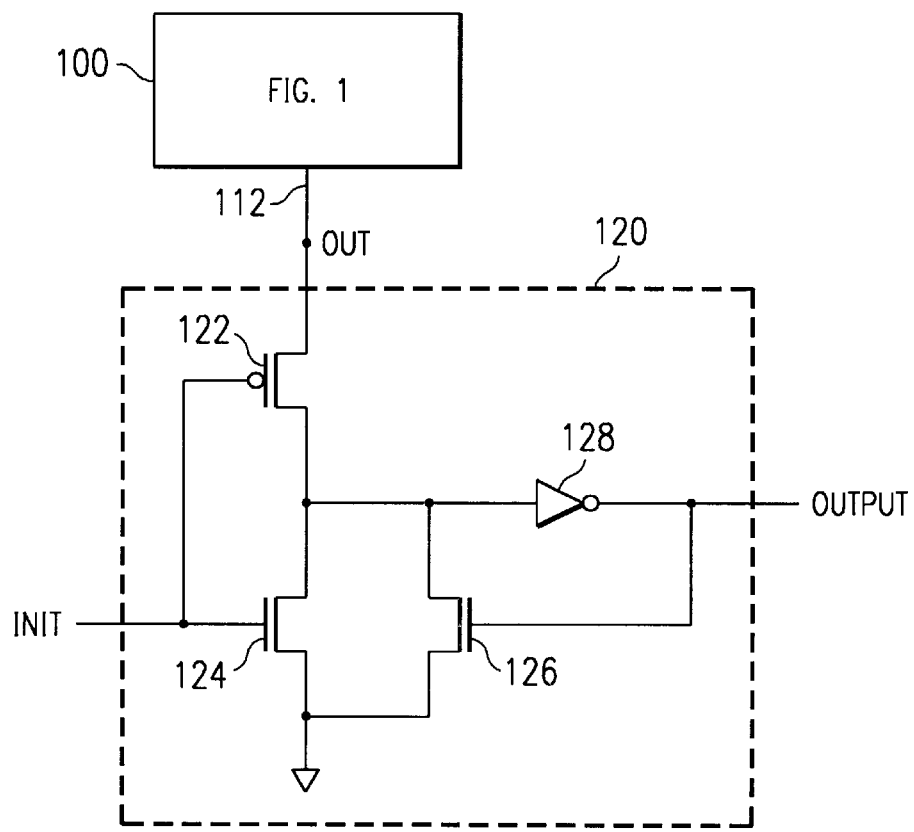
FIG. 2 is a schematic diagram illustrating the redundant fuses of FIG. 1 in conjunction with a fuse latch circuit.

Now referring to FIG. 2, there is shown a schematic diagram illustrating the fuse circuit 100 of FIG. 1 in conjunction with a fuse latch circuit 120. The fuse latch circuit 120 generates an output signal (OUTPUT) having a first state when one or both of the fuses 102, 104 are blown (open-circuited) and having a second state when none of the fuses 102, 104 are blown. The fuse latch circuit 120 shown is only one embodiment of a fuse latch circuit that may be utilized with the fuse circuit 100. It will be understood that many configurations of latch circuits may be utilized as long as the desired results are achieved.

In the embodiment shown in FIG. 2, the fuse latch circuit 120 includes a p-channel MOS transistor 122 coupled to the node (OUT) 112 of the fuse circuit 100, two n-channel MOS transistors, and an inverter 128, all configured as shown. An initialize signal (INIT) is coupled to the gate (control) terminals of the transistors 122, 124. The INIT signal is a pulsed signal that latches in the state of the fuse circuit 100 (state one—at least one fuse blown; state two—no fuses blown). In the present embodiment shown, the INIT signal is normally active high, and after the pulse goes low, the state of the fuse circuit 100 is latched, with a logic zero output when none of the fuses is blown and a logic one when at least one of the fuses is blown. Described in a different way, the node 112 is coupled to the voltage reference (VREF2) (see FIG. 1) when none of the plurality of fuses are blown and decoupled from the voltage reference (VREF2) when at least one of the plurality of fuses is blown.

Although the present invention and its advantages have been described in the foregoing detailed description and illustrated in the accompanying drawings, it will be understood by those skilled in the art that the invention is not limited to the embodiment(s) disclosed but is capable of numerous rearrangements, substitutions and modifications without departing from the spirit and scope of the invention as defined by the appended claims.

What is claimed is:

1. A fuse circuit in an integrated circuit, comprising:
   a first fuse comprising a conductive material and having a first side and a second side, the first side coupled to a first node and the second side coupled to a second node;
   a first control device having a first terminal, a second terminal, and a control terminal, the first terminal coupled to the first node, the second terminal coupled to a first reference voltage, and the control terminal coupled to a first fuse control signal whereby the first control device is operable, in response to the first fuse control signal, to cause an electric current to flow through the first fuse sufficient to blow open the first fuse;
   a second fuse comprising a conductive material and having a first side and a second side, the first side coupled to the second node and the second side coupled to a second reference voltage; and
   a second control device having a first terminal, a second terminal, and a control terminal, the first terminal coupled to the second node, the second terminal coupled to a third reference voltage and the control terminal coupled to a second fuse control signal whereby the second control device is operable, in response to the second fuse control signal, to cause an electric current to flow through the second fuse sufficient to blow open the second fuse.

2. The circuit in accordance with claim 1 further comprising a latch circuit operable for generating an output signal having a first logic state in response to a first condition wherein at least one of the first or second fuses are blown and a second logic state in response to a second condition wherein none of the first or second fuses are blown.

3. The circuit in accordance with claim 1 wherein the first node is open-circuited when at least one of the first or second fuses are blown and is coupled to the second reference voltage when none of the first or second fuses are blown.

4. The circuit in accordance with claim 1 wherein the second terminal of the first control device and the second terminal of the second control device are coupled to a same voltage reference.

5. The circuit in accordance with claim 1 wherein the first and second control devices each comprise an n-channel transistor.

6. The circuit in accordance with claim 5 wherein the second reference voltage is power and the first and third reference voltages are ground.

7. The circuit in accordance with claim 1 wherein the first and second fuses comprise doped polysilicon.

8. The circuit in accordance with claim 7 wherein the polysilicon is unsalicided.

9. The circuit in accordance with claim 1 wherein the first fuse has a first power dissipation per unit cross section area and the second fuse has a second power dissipation per unit cross section area, and the first power dissipation per unit cross section area is greater than the second power dissipation per unit cross section area.

10. A circuit for providing fuse redundancy in an integrated circuit, comprising:

a series-coupled plurality of fuses comprising conductive material and having a first end and a second end, the first end coupled to a first voltage reference, each of the plurality of fuses coupled to a corresponding one of a plurality of fuse control devices operable for controlling an electric current flowing through the fuse in response to a corresponding one of a plurality of fuse control signals, the second end of the plurality of fuses coupled to the first voltage reference when none of the plurality of fuses are blown and decoupled from the first voltage reference when at least one of the plurality of fuses is blown.

11. The circuit in accordance with claim 10 further comprising a latch circuit coupled to the second end of the series-coupled plurality of fuses and operable for generating an output signal having a first logic state in response to a first condition wherein at least one of the plurality of fuses is blown and a second logic state in response to a second condition wherein none of the plurality of fuses are blown.

12. The circuit in accordance with claim 10 wherein the plurality of fuses comprises a first fuse having a first power dissipation per unit cross section area and a second fuse having a second power dissipation per unit cross section area, and whereby the first power dissipation per unit cross section area is greater than the second power dissipation per unit cross section area.

13. The circuit in accordance with claim 10 further comprising:

a first control device having a first terminal, a second terminal and a control terminal, the first terminal coupled to a one of the plurality of fuses, the second terminal coupled to a second reference voltage, and the control terminal coupled to a first fuse control signal for generating an electric current between the first reference voltage and the second reference voltage and flowing through the one of the plurality of fuses, the electric current sufficient to blow the one of the plurality of fuses; and a second control device having a first terminal, a second terminal and a control terminal, the first terminal coupled to another one of the plurality of fuses, the second terminal coupled to the second reference voltage, and the control terminal coupled to a second fuse control signal for generating an electric current between the first reference voltage and the second reference voltage and flowing through the other one of the plurality of fuses, the electric current sufficient to blow the other one of the plurality of fuses.

14. The circuit in accordance with claim 13 wherein the first and second control devices each comprise an n-channel transistor.

15. The circuit in accordance with claim 14 wherein the first reference voltage is power and the second reference voltage is ground.

16. The circuit in accordance with claim 10 wherein each of the plurality of fuses comprises doped polysilicon.

17. The circuit in accordance with claim 16 wherein the polysilicon is unsalicided.

18. A method of blowing electric fuses, comprising:

generating a first electric current flowing through a first fuse and a second fuse, the electric current having a magnitude sufficient to blow the first fuse, the first fuse comprising conductive material and having a first end and second end; and generating a second electric current flowing through the second fuse sufficient to blow the second fuse, the second fuse comprising conductive material and having a first end and second end, the first end of the second fuse coupled to a first voltage reference, and the first end of the first fuse coupled to the second end of the second fuse.

19. The method in accordance with claim 18 wherein the step of generating the second electric current occurs after the step of generating the first electric current.

20. The method in accordance with claim 18 wherein the first fuse and the second fuse each comprise doped polysilicon.

21. The method in accordance with claims 18 further comprising:

latching a state of the first and second fuses; and outputting a first logic signal in response to a first state of the first and second fuses and outputting a second signal in response to a second state of the first and second fuses.

* * * * *